United States Patent [19]

Serravalle, Jr.

[11] Patent Number: 4,631,525
[45] Date of Patent: Dec. 23, 1986

[54] DIGITAL FADER OR LIKE DEVICE

[75] Inventor: Joseph M. Serravalle, Jr., Boca Raton, Fla.

[73] Assignee: Sony Corporation, Tokyo, Japan

[21] Appl. No.: 483,856

[22] Filed: Apr. 11, 1983

[51] Int. Cl.⁴ .............................................. G08C 9/02
[52] U.S. Cl. .................. 340/365 S; 307/116; 340/712; 381/109
[58] Field of Search ............... 340/365 R, 365 S, 711, 340/712; 455/158, 159, 232; 381/109; 307/116, 140, 149

[56] References Cited

U.S. PATENT DOCUMENTS

| 3,588,875 | 6/1971 | Gabor | 340/365 S |
| 4,152,699 | 5/1979 | Sachsse | 340/365 P |
| 4,204,204 | 5/1980 | Pitstick | 340/712 |
| 4,221,975 | 9/1980 | Ledniczki | 307/116 |
| 4,242,676 | 12/1980 | Piguet | 340/712 |

Primary Examiner—John W. Caldwell, Sr.
Assistant Examiner—Michael F. Heim
Attorney, Agent, or Firm—Lewis H. Eslinger; Alvin Sinderbrand

[57] ABSTRACT

A digital fader or like device having slidably operable means, such as a touch-sensitive strip, which is manually operable to different settings that are represented by a digital signal. Manual changes in the relative operating position of the slidably operable means produce corresponding adjustments in the digital signal. Display elements are selectively energized by the digital signal to indicate the relative setting of the slidably operable means.

26 Claims, 5 Drawing Figures

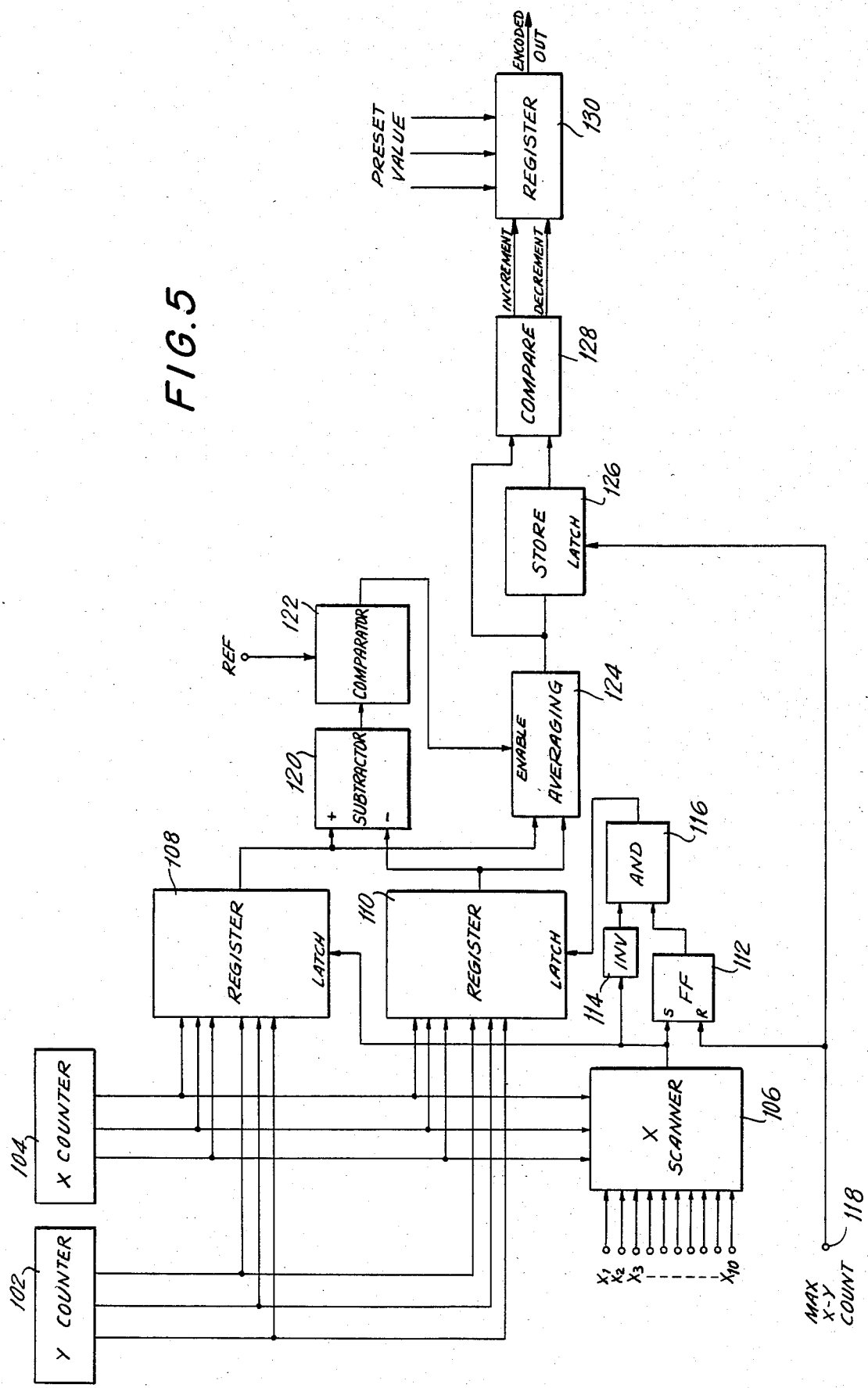

DIGITAL FADER OR LIKE DEVICE

BACKGROUND OF THE INVENTION

This invention relates to a digital fader or like device having slidably operable means whose setting is represented by a digital signal and, more particularly, wherein adjustments to the setting are reflected by adjustments in the digital signal, which signal may be used to selectively energize a display, or may be recorded, or may be otherwise utilized.

Manually adjustable devices, such as slide resistors, potentiometers, rheostats, and the like, conventionally are used to set and vary characteristics of diverse type. For example, such devices may be manually operated to establish the gain or attenuation of a signal, to select a particular frequency and to control numerous other functions. In audio signal processing applications, the gain or level of an audio signal may be set and adjusted so as to effect a desired volume control.

In some applications, such as in some audio signal processing applications, it is desirable that the setting of a gain or volume control device be stored for utilization at a subsequent time. This is particularly useful for audio engineers and technicians who operate audio mixers. As is known to those of ordinary skill in the art, an audio mixer is a multi-channel device wherein different channels of audio signals are supplied to respective, individual inputs, each channel being subjected to independent amplification or volume control, filtering, and ancillary processing to create desired sound effects. The processed channels then are recorded in individual tracks on a record medium, such as a magnetic tape. Subsequently, the audio signals recorded in the individual tracks are reproduced and blended together, or "mixed" to create a master tape which then may be used to produce replica tapes or phonograph discs.

When using a mixer, the operator typically effects continual adjustment of the various volume control devices while recording a single "pass" or "take" of a musical performance. Hence, an individual volume control device, or fader, will have its setting changed virtually continually. Of course, at the completion of the recording of a pass, the setting of the fader will be quite different than that at the beginning of the pass. When another pass is to be recorded, either in its entirety or selected portions thereof, it is important that the operator be apprised of the setting of the fader during the previous pass so that this setting can be duplicated quickly and easily for the next recording or for an editing or re-dubbing operation. This is because, in editing and re-dubbing, it is best to be able to duplicate the previous settings and then, if the operator so desires, to vary or adjust the fader during the next pass.

In recording audio signals processed by a mixer, in addition to recording the audio signals in separate tracks, the volume or gain control as established by the fader also is recorded. For example, when using a multiple of faders, the volume setting established by such faders may be multiplexed and recorded in a single track of a record medium. Alternatively, the volume setting of each fader may be recorded periodically, or multiplexed with the audio signal whose characteristic is controlled by that fader, in the very same track as the audio signal itself. When the record medium is reproduced, the volume settings of the individual faders also are reproduced. This reproduced volume setting information is used by the operator to reset the fader at the same position as was used during the previously recorded pass, thereby establishing the same volume control as before. This resetting of the fader is, however, relatively laborious and is not easily carried out except by a skilled technician. This is because, during a reproducing operation, the actual volume setting that had been recorded and is now reproduced from the tape is compared to the present volume setting of the fader. When the present setting becomes equal to the previously recorded setting, a "null" display light is triggered. Typically, to achieve this null indication, a number of reproducing operations must be carried out repeatedly so that the fader can be adjusted to match the setting which had been recorded.

OBJECTS OF THE INVENTION

Therefore, it is an object of the present invention to provide improved fader or volume control apparatus which can be used in conjunction with an audio mixer and which overcomes the aforenoted problems, disadvantages and defects.

Another object of this invention is to provide a fader or volume control device which can be used in an audio mixer to record multiple channels of audio signals, wherein the previous setting of the fader or volume control device that had been used for recording may be duplicated easily and quickly so that, during an edit, re-dubbing or re-recording operation, the previous volume adjustment can be quickly obtained.

A more general object of this invention is to provide improved slidable adjustment apparatus wherein the relative position of a slidably operable element is represented by a digital position signal which can be used to energize a suitable display.

An additional object of this invention is to provide apparatus of the aforementioned type wherein the display, as aforesaid, may be energized by an external digital position signal, as by such a signal that is reproduced from a record medium, thereby providing a display of a previous setting of the slidably operable element.

Yet another object of this invention is to provide a novel technique for sensing and encoding the relative position of a slidably operable element, thereby producing a digital signal representing that position.

A further object of this invention is to provide apparatus capable of carrying out the aforementioned technique, wherein the digital signal is incrementally adjustable in response to changes in the relative position of the slidably operable element.

A still additional object of this invention is to provide apparatus for selectively adjusting a digital position signal representative of the operating position of a slidably operable element in response to the manual operation of an adjustment control device.

Various other objects, advantages and features of the present invention will become readily apparent from the ensuing detailed description, and the novel features will be particularly pointed out in the appended claims.

SUMMARY OF THE INVENTION

In accordance with a broad aspect of this invention, apparatus is provided for producing a digital signal representing the relative position of a slidably operable adjustment member. Preferably, this adjustment member is included in a fader, volume control device, variable gain circuit, or the like. In one embodiment thereof, the slidably operable adjustment member comprises a touch-sensitive strip having first and second overlying portions, one of which being relatively flexible with respect to the other so as to contact that other portion at a location corresponding to the position of an operator's finger thereon. As one example, one of the overlying portions of the touch-sensitive strip is resistive, distributed over a predetermined length thereof, and the other portion is provided with a reference potential such that, when contact between the portions is made, the effective resistance of the first-mentioned portion is determined by the particular location at which the other portion is in contact therewith. This effective resistance is used in a voltage divider circuit; and an analog-to-digital converter produces a digital signal representing this effective resistance. In another example, one of the portions of the touch-sensitive strip is provided with a multiple of discrete conductive elements, and the other portion is provided with a reference potential such that, when the two portions are brought into contact, the reference potential is coupled to a particular conductive element corresponding to the location of this contact. The conductive elements are scanned successively, and the identity of that element to which the reference potential is coupled is used to produce the digital signal representing contact location.

In accordance with another aspect of this invention, the digital signal which represents contact location and, thus, the relative position of the slidably operable adjustment member, may be adjusted by moving the operator's finger along the touch-sensitive strip. Changes in the location of the operator's finger, that is, changes in the location of contact between the overlying portions of the touch-sensitive strip, are detected and used to increment or decrement the digital signal, depending upon the direction in which the operator's finger is moved.

In accordance with yet another aspect of this invention, a visual display comprising individually energizable light emitting elements is provided, the digital signal being used to energize a corresponding one of these elements. An external digital signal may be used to energize the display. As an example, when the apparatus is used in an audio mixer to record multiple channels of audio signals which are individually processed (e.g. volume-controlled) by respective faders, the settings of such faders are represented by digital signals which also are recorded and, during playback, the reproduced digital signals are used to energize respective displays, each representing the particular setting of an associated fader. Thus, during playback, the previous setting of a fader is quickly and readily displayed.

In accordance with a still further aspect of this invention, the electronic setting of a slidable member, such as a member provided with a slidable lever, may be varied to effect fine adjustments thereof. For example, another manually operable positioning device, such as a separate vernier, may be operated; and changes in the setting of that device are detected and used to effect incremental changes in a digital signal representing the electronic setting of the slidable lever. The electronic setting may represent a digital volume level signal which establishes the volume level setting of an audio signal that is processed (e.g. amplified or attenuated) by the slidable device.

BRIEF DESCRIPTION OF THE DRAWINGS

The following detailed description, given by way of example, will best be understood in conjunction with the accompanying drawings in which:

FIG. 5 is a block diagram of one embodiment of an encoder that may be used with the present invention.

DETAILED DESCRIPTION OF CERTAIN PREFERRED EMBODIMENTS

In its broader aspects, the present invention relates to apparatus for producing a digital signal representing the relative position of a slidably operable adjustment member. The adjustment member may be the manually operable control element of, for example, a variable resistive device, a gain-setting device, a volume adjustment device, or virtually any other device whose setting may be adjusted by an operator. However, in order to best appreciate the advantages and improvements attained by this invention, it is described hereinbelow in the environment of a "fader" used in a multi-channel audio mixing device. As is recognized by those of ordinary skill in the art, a fader typically may be viewed as a volume control device whose setting many be manually adjusted by an operator for selecting the volume of an audio signal. More particularly, the setting of the fader establishes the gain of an audio amplifier, such as a voltage-controlled amplifier (VCA), thereby determining the volume of the audio signal which is amplified thereby.

Figure 1:
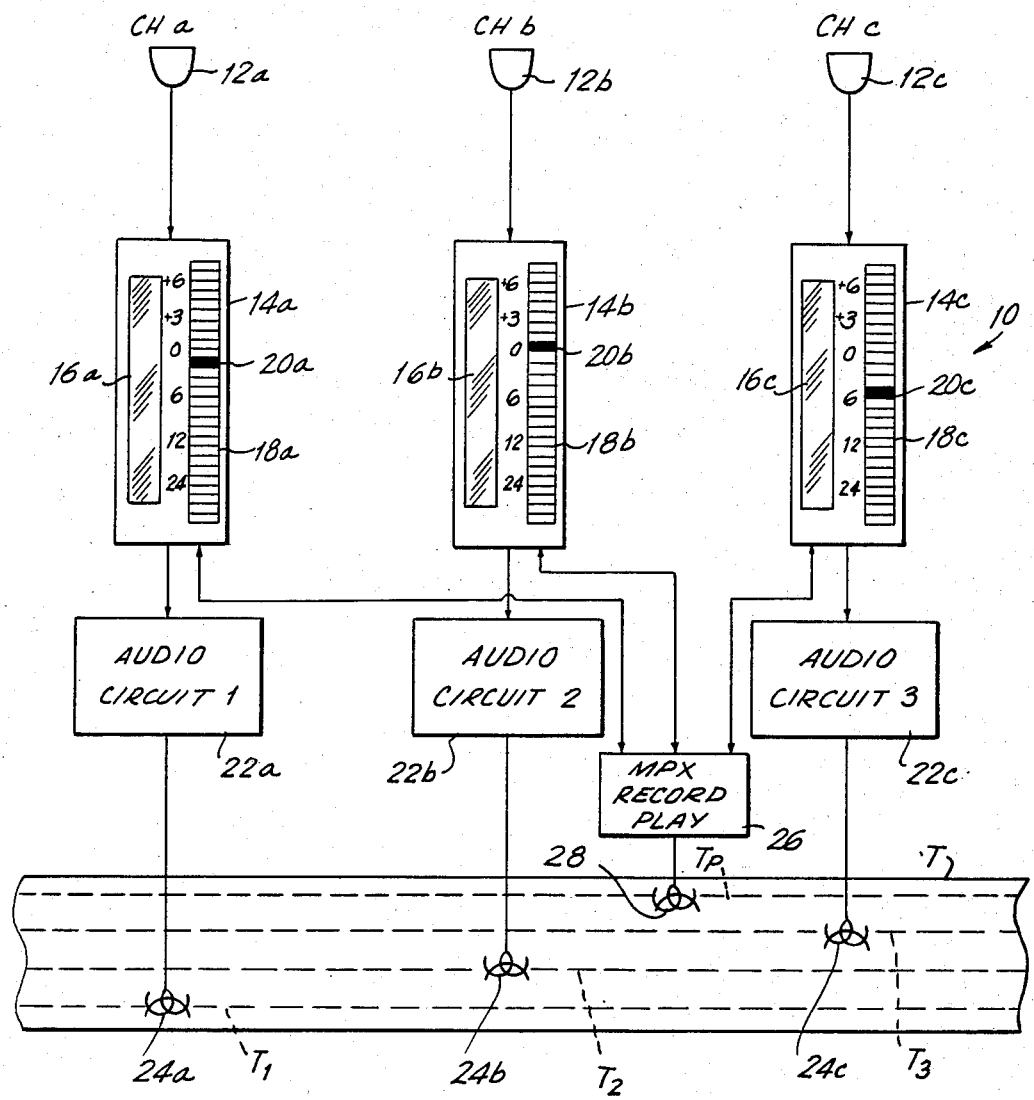
FIG. 1 is a partial block, partial schematic diagram representing a portion of audio mixing apparatus with which the present invention finds ready application.

Turning now to FIG. 1, there is a illustrated a portion of audio mixing apparatus 10 wherein multiple channels of audio signals, such as channels a, b, c . . . and so on, are selectively processed and recorded in respective tracks on a record medium, such as a multi-track magnetic tape T. In FIG. 1, each channel comprises a microphone 12 for transducing audio sounds into corresponding electrical signals, a fader, or volume control device, 14 for adjustably setting the gain or volume of the audio signals included in that channel, and audio processing circuit 22, such as a circuit comprising one or more amplifiers, equalizers and filters, and a transducer 24, such as a magnetic recording/playback head. In each channel of the audio mixing apparatus, microphone 12 is coupled to fader 14 which, in turn, is coupled to transducer 24 via audio circuit 22. In FIG. 1, the suffix a, b, c . . . , identifies the particular channel in which the respective elements are provided.

A conventional fader typically includes a slide lever whose relative position along an index serves to establish the gain or volume of the audio signal which is processed by that fader. In accordance with one aspect of the present invention, the usual slide lever of the fader is replaced by a touch-sensitive strip 16 which, in the preferred embodiment, is not provided with an operator-actuated control lever, knob, or the like. Rather, to set the appropriate gain or volume of the audio signal processed by the fader, the operator merely places his finger on the touch-sensitive strip, and the gain or volume is adjusted when the operator slides his finger either upwardly or downwardly on the strip. Adjacent touch-sensitive strip 16 is a display 18 which, preferably, is comprises an array of light elements 20. The expression "light elements", as used herein is intended to refer to light emitting elements, such as light emitting diodes (LED), fluorescent devices, and the like, as well as light reflecting devices, such as liquid crystal displays (LCD) or the like. Of course, when the audio mixing apparatus is used in relatively dim light conditions, it is preferred that display 18 comprise light emitting elements. Furthermore, and as illustrated in FIG. 1, such light emitting elements are disposed in a linear array so as to form an index adjacent touch-sensitive strip 16. Suitable markings or other indicia, such as notations which indicate the relative gain or volume (in decibels) of the audio signal are provided so as to apprise the operator of the gain or volume setting of the fader.

The individual light emitting elements which constitute the linear array of display 18 are selectively energized to display the particular setting of fader 14. A change in that setting, as by the sliding of the operator's finger along touch-sensitive strip 16, results in a corresponding change in the particular light emitting element which is energized. Thus, the operator is apprised of changes in the setting of the fader.

As will be described below, the setting of each fader is represented by a corresponding digital position, or volume level, signal. Thus, the individual setting of fader 14a is represented by an individual digital position, or volume level, signal (referred to herein, for convenience, merely as a digital signal), the setting of fader 14b is represented by an individual digital signal and the setting of fader 14c likewise is represented by an individual digital signal. The respective digital signals which represent the settings of faders 14a–14c are recorded. In the embodiment illustrated in FIG. 1, these digital signals are multiplexed by a multiplexing circuit 26 and recorded in a separate track $T_P$ on magnetic tape T by magnetic transducer 28. As will be explained, the digital signal produced by each fader changes relatively slowly and, therefore, samples of all of these signals may be produced and multiplexed so as to be recorded in a single track $T_P$. The multiplexed digital signals may be provided with suitable addresses so as to identify the particular faders whose relative positions, or volume levels, such signals represent. In this manner, the digital signal associated with fader 14a will be identified correctly as will the digital signals associated with faders 14b and 14c. Since these digital signals change relatively slowly, the multiplexing thereof for recording in a single track $T_P$ advantageously conserves magnetic tape for the recording of audio signals. As an alternative, the respective digital position, or volume level, signals may be recorded in individual tracks $T_1$, $T_2$ and $T_3$ which are associated with channels a, b and c, respectively. Such digital signals may be multiplexed with the audio signals and also may be suitably identified 20 that these digital position, or volume level, signals may be detected during playback. Thus, the setting of fader 14a may be recorded in track $T_1$, multiplexed with the channel a audio signals; the setting of fader 14b may be recorded in track $T_2$, multiplexed with the channel b audio signals; and the setting of fader 14c may be recorded in track $T_3$, multiplexed with the channel c audio signals. As yet a further alternative, a separate record medium, such as a separate magnetic tape or, preferably, a magnetic disc (e.g. a floppy disc or diskette) may be provided to record only the digital signals which represent the settings of the respective faders.

In operation, magnetic tape T is advanced to record a "pass" or "take" wherein multiple audio channels are processed and recorded in respective tracks $T_1$, $T_2$, $T_3$ and so on. The gain or volume of each channel is determined by the setting of faders 14a, 14b and 14c, respectively. As the audio signals are recorded in separate tracks, digital signals representing the settings of the respective faders also are recorded in, for example, track $T_P$. Normally, during a "pass", the operator will adjust the settings of the respective faders continually in order to properly "mix" or balance the individual audio channels. Adjustments or changes in the settings of the faders are represented by corresponding adjustments or changes in the digital position, or volume level, signals which are recorded in track $T_P$. Such changes or adjustments in the settings of the faders are indicated by displays 18a, 18b and 18c. Thus, the particular light emitting element which is energized in each display is determined by the setting of the fader. As the position, or volume level, changes, such as if the volume level increases, a corresponding change is indicated by the display. Such adjustments in the digital position, or volume level, signal are recorded on magnetic tape T. Thus, a record is made of the particular settings of the respective faders throughout the "pass".

Let it be assumed that another "pass" is to be made, such as for the purpose of editing, re-dubbing, re-recording, or the like. The audio channels recorded on tape T are reproduced until the desired location of this tape is reached. At that time, the settings of the respective faders should correspond to those settings which had been present at the time that this portion of the tape was recorded. Of course, at the completion of the previous "pass", that is, prior to the time that the tape was reproduced in preparation for this next-following "pass", the settings of the respective faders are arbitrary and, thus, probably are quite different from the settings that were used initially. However, in accordance with the present invention, as tape T is reproduced, the digital position, or volume level, signals which had been recorded for each fader during the previous "pass" are reproduced by transducer 28 and supplied by multiplexer 26 to displays 20a, 20b and 20c, respectively. Thus, during signal reproduction, the displays provide indications of the settings of the respective faders that had been used when the previous "pass" was recorded. Consequently, when the desired portion of tape T is reached, the previous settings of the faders which correspond to this portion of the tape are displayed. Suitable means (not shown) may be provided in each fader to store such settings so that, when the next "pass" is made, these very same settings may be used to establish the desired gain or volume of the respective audio channels. Alternatively, and as will be described below, if these previous settings are to be adjusted at the next "pass", such adjustments may be made by sliding the operator's finger along the corresponding touch-sensitive strip 16a, 16b or 16c.

Thus, the difficulty noted hereinabove in reestablishing the previous settings of the faders when a subsequent "pass" is made, is easily overcome in accordance with the apparatus illustrated in FIG. 1. The previous settings of the faders are displayed quickly and automatically by displays 18a, 18b and 18c when the previously recorded audio channels are reproduced from tape T.

Once these previous settings are known, the operator may change them as desired.

Figure 2:
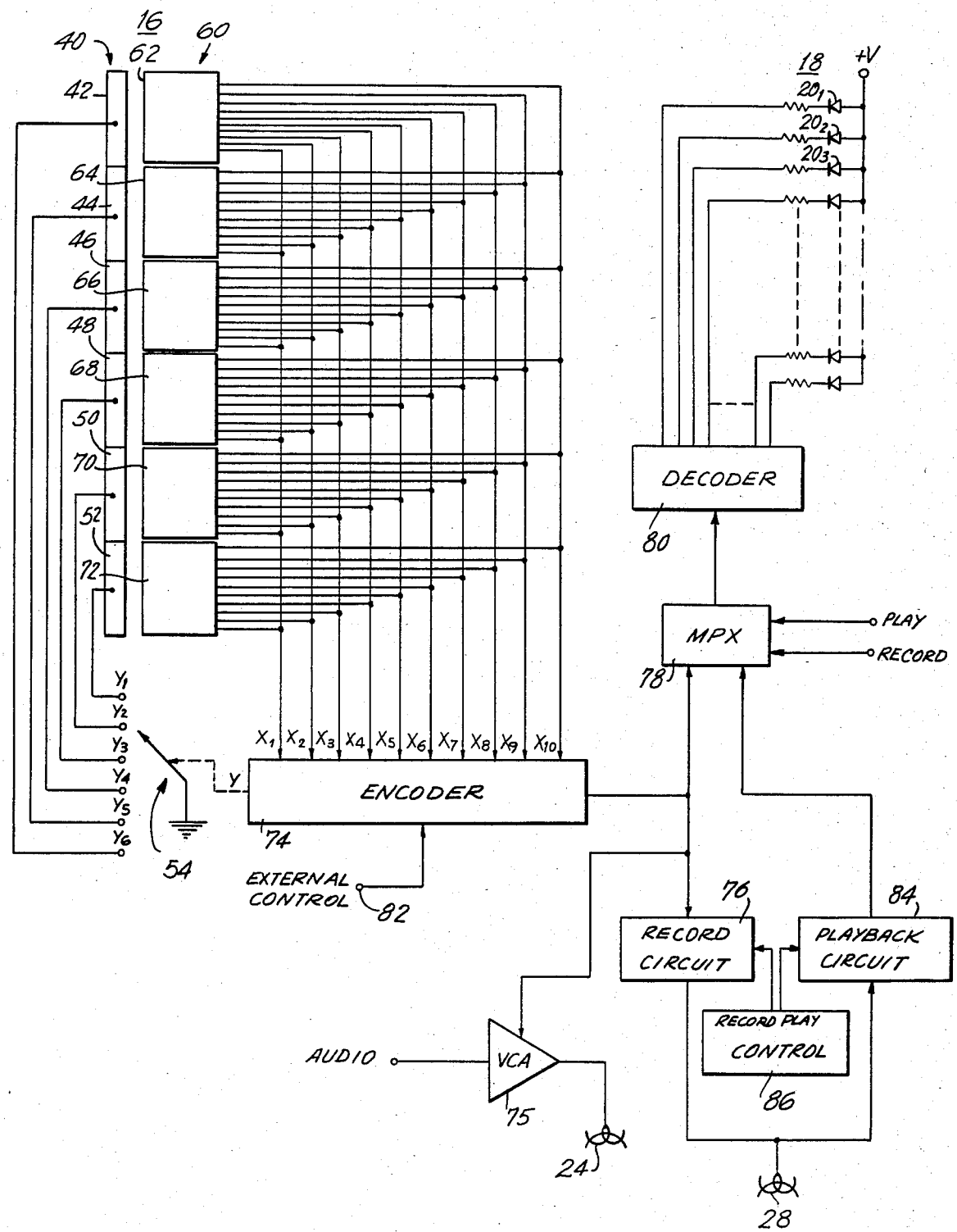
FIG. 2 is a partial block, partial schematic diagram of one embodiment of the present invention.
Figure 3:
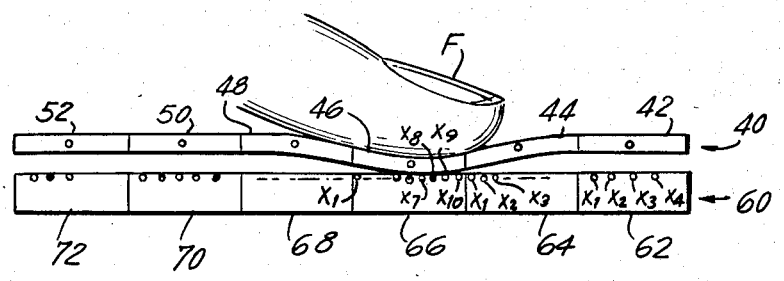
FIG. 3 is a schematic representation of one embodiment of a touch-sensitive strip that may be used with the embodiment shown in FIG. 2.

One embodiment of touch-sensitive strip 16, as used in combination with circuitry for producing a digital position, or volume level, signal derived from the operation of the touch-sensitive strip, in further combination with display 18, is illustrated in FIG. 2. Touch-sensitive strip 16 comprises two overlying portions, or strips, 40 and 60. Preferably, strip 40 is flexible with respect to strip 60 and, normally, the two strips are spaced apart from each other. When finger pressure is exerted on strip 40, the two strips are brought into contact with each other at a location determined by the position of an operator's finger along the length of strip 40. This is schematically illustrated in FIG. 3 wherein finger F exerts pressure on strip 40 to bring the two strips into contact with each other at a location determined by the relative location of the finger along the length of strip 40.

Strip 40 is divided into plural segments, such as segments 42, 44, 46, 48, 50 and 52. Each segment is electrically insulated from the other segments, and each segment is electrically conductive. As illustrated, segments 42, 44, 46, 48, 50 and 52 are coupled to terminals $Y_6$, $Y_5$, $Y_4$, $Y_3$, $Y_2$ and $Y_1$, respectively. As will be described, a reference potential, such as ground, is supplied to each of these terminals and, thus, to each of the segments, in sequence.

Strip 60 is divided into an equal number of groups 62, 64, 66, 68, 70 and 72. Each group is provided with a number of electrically conductive elements, such as conductive leads which may be etched, deposited or otherwise provided on the surface of the respective groups which face segments 42–52, respectively. Thus, group 62 is provided with conductive elements $X_1$, $X_2$, $X_3$, ... $X_{10}$. Likewise, group 64 is provided with these same conductive elements which, as illustrated, are connected in common with the corresponding conductive elements in group 62. In similar fashion, groups 66, 68, 70 and 72 each are provided with conductive elements $X_1$–$X_{10}$ and respective ones of these conductive elements in each group are connected in common. FIG. 3 is a side elevational view of conductive elements $X_1$–$X_{10}$ on the surface of each of groups 62–72, respectively. It is seen that, when finger pressure is exerted on strip 40, this strip is brought into contact with strip 60 and one or more segments of strip 40 contact corresponding groups of strip 60. In particular, particular conductive elements in strip 60 will be in electrical contact with a corresponding segment of strip 40. In FIG. 3, conductive segments $X_7$, $X_8$, $X_9$ and $X_{10}$ in group 66 are in electrical contact with segment 46. Of course, the number of conductive elements which are contacted by a segment is determined by the pressure exerted on strip 40 as well as the dimension of the operator's finger F. In the example of FIG. 3, it is appreciated that the pressure exerted on strip 40 by finger F may bring segment 44 into contact with conductive elements $X_1$ and $X_2$ of group 64.

Returning to FIG. 2, terminals $Y_1$–$Y_6$ are coupled to a segment scanner 54 which is schematically illustrated as a rotary switch whose movable contact sequentially engages terminals $Y_6$, $Y_5$, ... $Y_1$, in order. Segment scanner 54 is controlled by, for example, a suitable counter included in encoder 74, as will be described. In FIG. 2, the output lead Y, illustrated in broken lines, extends from encoder 74 to segment scanner 54 to represent that the particular contact which is engaged by the segment scanner is determined by the count of a counter Y, referred to herein as the Y-count.

Conductive elements $X_1$ in each of groups 62–72 are connected in common to an input $X_1$ of encoder 74. Likewise, conductive elements $X_2$ in each of groups 62–72 are connected to an input $X_2$ of the encoder. In similar fashion, the remaining respective conductive elements in each of the groups are connected in common to inputs $X_3$, $X_4$ ... $X_{10}$, respectively, of encoder 74. It will be appreciated that, when strip 40 is brought into contact with strip 60, one or more conductive elements $X_1$–$X_{10}$ will be provided with a reference potential, such as ground, when segment scanner 54 scans a corresponding one of terminals $Y_1$–$Y_6$. For example, in the illustration of FIG. 3, when scanner 54 scans terminal $Y_4$ to supply reference potential to segment 46, conductive elements $X_7$–$X_{10}$ will be provided with this reference potential. Encoder 74 is adapted to produce a digital signal representing the particular Y terminal as well as the particular X conductive segments which are supplied with reference potential. This digital signal, which may be produced by the combination of a Y-count and a X-count, represents the location at which strip 40 contacts strip 60. This digital signal thus represents the relative location of the operator's finger F along the length of touch-sensitive strip 16 and, thus, represents the volume level setting of the fader in which this touch-sensitive strip is included.

The output of encoder 74 is coupled to a record circuit 76 and also to a voltage-controlled audio amplifier (VCA) 75. This VCA is coupled to receive an audio signal and to amplify that audio signal in accordance with the digital signal supplied thereto by encoder 74. As one example thereof, the VCA may be a digital VCA such as DBX Model 2151. Alternatively, a digital-to-analog (D/A) converter may be used to convert the digital signal produced by encoder 74 to a corresponding analog voltage which establishes the gain of the VCA. The amplified audio signal produced by the VCA is supplied to transducer 24 for recording on magnetic tape T. Likewise, the digital signal produced by encoder 74 is supplied by record circuit 76 to transducer 28 for recording in track $T_P$.

The output of encoder 74 also is coupled via a multiplexer 78 to a decoder 80. This decoder is coupled to light emitting elements $20_1$, $20_2$, ... and so on, included in display 18. The decoder may be a conventional decoding and driving circuit known to those of ordinary skill in the art. Depending upon the digital signal supplied to the decoder, an individual light emitting element 20 is energized. If the value of this digital signal changes, the particular light emitting element which is energized by decoder 80 likewise is changed.

Multiplexer 78 also includes another input which is coupled by a playback circuit 84 to transducer 28. During a playback operation, as when a previous "pass" is reproduced for editing, re-dubbing or re-recording, the digital position, or volume level, signal which had been recorded in track $T_P$ (FIG. 1) is reproduced therefrom by transducer 28 and supplied via the playback circuit to multiplexer 78. Although not shown in FIG. 2, it will be appreciated that, if the digital position signals derived from faders 14a–14c are multiplexed, a suitable identifying circuit, or decoder, is included in playback circuit 84 so as to supply the multiplexer 78 with only the digital position signal which is associated with the corresponding fader. Thus, if multiplexer 78 is included in fader 14a, then only the digital position signal associated with fader 14a is supplied by playback circuit 84 to the multiplexer. As an alternative, and as will be described below, the reproduced digital position signal may be supplied to encoder 74 from which it energizes display 18.

A record/playback control circuit 86 includes a "record" control output and a "play" control output adapted to produce RECORD and PLAY control signals, respectively. For example, a suitable record/playback selector switch may be coupled to control circuit 86 to determine which of the RECORD and PLAY control signals is produced. When a recording operation is selected, control circuit 86 supplies the RECORD control signal to record circuit 76, thereby enabling this record circuit to couple the digital position, or volume level, signal produced by encoder 74 to transducer 28 to be recorded in track $T_P$ (FIG. 1). At the same time, the RECORD control signal is supplied to multiplexer 78 to enable the latter to supply this digital position, or volume level, signal to decoder 80. Hence, during the recording operation, the digital position, or volume level, signal is recorded and, moreover, display 18 is selectively energized to indicate the relative position or setting of touch-sensitive strip 16 and, thus, the volume level of this channel (i.e. the channel in which the fader is located). During a playback operation, control circuit 86 produces the PLAY control signal which actuates playback circuit 84 to supply the digital position, or volume level, signal reproduced from track $T_P$ by transducer 28 to multiplexer 78. Also, the PLAY control signal is supplied to the multiplexer, thereby enabling the latter to couple the reproduced digital position, or volume level, signal to decoder 80.

It is appreciated that the record and playback circuits 76 and 84 are mutually exclusively actuated by control circuit 86 so that only one of these circuits is enabled at a time either to record the digital position, or volume level signal, or to reproduce that signal.

FIG. 2 also illustrates an input terminal 82 to which an external control signal is supplied. This external control signal may be a digital position, or volume level, signal produced from an external source, such as a master control, which simulates, or replaces, the digital position, or volume level, signal produced by encoder 74. For example, in the multi-channel audio mixing apparatus illustrated in FIG. 1, a master control, such as a master fader, may be provided to supply the external digital control signal to input terminal 82 of each fader, thereby establishing a master volume level for each VCA included in each channel. This master digital signal also is recorded via record circuit 76 and transducer 28; and additionally is used to energize display 18 included in each fader, as by being supplied through encoder 74, multiplexer 78 and decoder 80 therein. Hence, each fader may be operated individually or, by means of the external control signal supplied to input terminal 82, the settings of the faders may be controlled in common to effect uniform volume adjustment in all of the audio channels, if desired.

The operation of the apparatus illustrated in FIG. 2 now will be briefly described. Let it be assumed that a recording operation is to be carried out so as to record a "pass". Let it also be assumed that the operator desires a particular volume setting, or gain, for an audio channel, such as channel a, by positioning his finger on touch-sensitive strip 16 at the location illustrated in FIG. 3. As a result of finger pressure exerted on overlying strip 40, this strip is brought into contact with strip 60. In particular, segment 46 of strip 40 contacts group 66 and, in particular, segment 46 is in electrical contact with conductive elements $X_7$-$X_{10}$ included in group 66. When segment scanner 54 supplies reference potential to terminal $Y_4$, segment 46 couples this reference potential to conductive elements $X_7$-$X_{10}$. At this time, encoder 74 is supplied with a Y-count identifying terminal $Y_4$ and also with an X-count to identify the conductive elements to which the reference potential is coupled. As will be explained hereinbelow with respect to the embodiment shown in FIG. 5, encoder 74 may include an averaging or combining circuit so as to produce an "averaged" count representing a particular conductive element (such as conductive element $X_8$ or $X_9$) as the X-count. In any event, encoder 74 produces a digital signal representing a segment and conductive element that serves to identify the location of the operator's finger along the length of touch-sensitive strip 16. Not only does this digital signal represent the location of the operator's finger and, thus, the relative location of the point of contact between strips 40 and 60, but this digital signal also represents the selected volume level for this audio channel. This digital signal is recorded via record circuit 76 and transducer 28 in track $T_P$ of magnetic tape T; and an indication thereof is provided by the energization of a corresponding one of light emitting elements $20_1, 20_2, \ldots$ included in display 18. Thus, the operator is apprised of this particular setting of the fader. If the operator changes the position of his finger along strip 40, different conductive elements will be provided with the reference potential; and encoder 74 will produce a corresponding digital signal representing the shifted or adjusted position of the operator's finger and, thus, the adjusted volume level which has been selected for this audio channel. The resultant adjusted digital signal produced by encoder 74 is recorded and, moreover, display 18 now is selectively energized to indicate the new setting of the fader. Hence, an increase or decrease in the selected volume level, as by sliding finger F upwardly or downwardly on touch-sensitive strip 16, is indicated by a corresponding energization of an associated one of light emitting elements $20_1, 20_2, \ldots$; and a digital signal representing the new setting of the fader is recorded.

An advantageous aspect of the present invention is that changes in the setting of the fader may be effected by positioning the operator's finger at any location along the touch-sensitive strip and then by sliding that finger upwardly or downwardly from any arbitrarily selected position. That is, changes in the setting of the fader are produced by detecting changes in the location of contact between strips 40 and 60 and not necessarily by detecting the absolute (or actual) location of that contact.

During a reproducing operation, as when an edit, dubbing or re-recording operation is to be effected, previously recorded digital position, or volume level, signals are reproduced by transducer 28 and supplied therefrom via playback circuit 84, multiplexer 78 and decoder 80 to display 18. Depending upon the value of the reproduced signals, a corresponding one of light emitting elements $20_1, 20_2, \ldots$ is energized to provide an indication of the fader setting which had been used during the previous recording. Hence, when a desired portion of the tape is reached, display 18 indicates the previous fader setting, from which the operator then may make any changes therein as he desires. As mentioned above, such changes may be effected by the operator by placing his finger on touch-sensitive switch 16 at any arbitrary location, and then sliding his finger upwardly or downwardly, depending upon the direction in which he desires to change the value of the previous fader setting.

Figure 4:
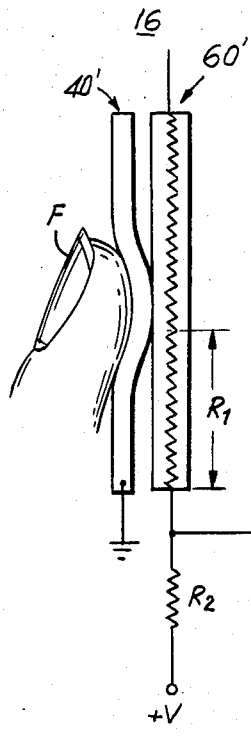
FIG. 4 is a partial block, partial schematic diagram of another embodiment of the present invention.

One embodiment of encoder 74 is described in detail hereinbelow with respect to FIG. 5. Before describing this embodiment, however, reference is made to FIG. 4 which illustrates a further embodiment of touch-sensitive switch 16 and a suitable encoder that may be used therewith. In this embodiment, strip 40' is coupled to the reference potential (such as ground) and, for example, may be substantially uniformly conductive. Strip 60', however, may be formed of resistive material which resistance, preferably, is distributed over the length of this strip. When strip 40' contacts strip 60' in response to finger pressure exerted thereon, the reference potential is supplied to that location along strip 60' at which contact is made. Now, if the distributed resistance R of strip 60' is connected in series with a discrete resistor $R_2$, as illustrated in FIG. 4, a voltage divider circuit is formed whose dividing ratio is equal to $R/R + R_2$. It is recognized that the value of the resistance R is a function of the location of the point of contact between strips 40' and 60'. As this location of contact moves upwardly, as viewed in FIGS. 1 and 4, the value of resistance R increases and, conversely, as this location of contact moves downwardly the value of resistance R decreases. In the embodiment of FIG. 4, the operator's finger F is positioned at a location on strip 40' such that the effective resistance R of the distributed resistance included in strip 60' is equal to $R_1$. Hence, in this embodiment, the voltage dividing ratio of the illustrated voltage divider is seen to be $R_1/R_1 + R_2$. If a source of operating potential V is supplied to this voltage divider by coupling the free end of discrete resistor $R_2$ thereto, then the illustrated voltage divider produces an output voltage level equal to $R_1V/R_1 + R_2$, wherein the value of $R_1$ is determined by the relative position of the operator's finger F along the touch-sensitive strip. This voltage level increases if the operator moves his finger in the upward direction and, conversely, decreases when the operator moves his finger in the downward direction. This output voltage, which represents the setting of the fader, is coupled to an encoder which now will be described.

The encoder illustrated in FIG. 4 is comprises an analog-to-digital (A/D) converter 90, a storage circuit 92, a comparator 96 and a presettable register 98. A clock circuit 94 is coupled to A/D converter 90 to supply periodic clock pulses thereto. The A/D converter responds to these clock pulses to sample the voltage derived from touch-sensitive strip 16 and produce corresponding digitized samples thereof. The digitized samples produced by A/D converter 90 are coupled to storage circuit 92 and also to one input of comparator 96.

Storage circuit 92 may comprise a latch circuit and includes a latch control terminal coupled to clock circuit 94 to receive clock pulses therefrom. The storage circuit responds to such clock pulses to store the digitized sample then supplied thereto from A/D converter 90. As one example, the clock pulses supplied to the latch control terminal of the storage circuit exhibit the same pulse repetition rate as the sampling rate of A/D converter 90 and, preferably, are phase-shifted with respect thereto. The phase difference between the sampling rate of A/D converter and the latch control clock pulses supplied to the storage circuit from clock circuit 94 is such that the storage circuit operates to store a preceding digitized sample prior to the next-following digitized sample produced by the A/D converter. The digitized sample stored in the storage circuit is coupled to another input of comparator 96.

Comparator 96 is operative to compare the preceding digitized sample to the next-following digitized sample. Thus, the digitized sample stored in storage circuit 92 is compared to the next digitized sample which is produced by A/D converter 90. Depending upon the difference between these compared samples, comparator 96 produces either an INCREMENT signal or a DECREMENT signal. The INCREMENT and DECREMENT signals are supplied to respective count-up and count-down inputs of register 98. It will be appreciated that register 98 may be a presettable up/down counter. A digital signal stored in this register (to be described) is incremented by a predetermined amount, such as by a count of one, in response to the INCREMENT signal supplied thereto. Conversely, the digital signal stored in this register is decremented by the same predetermined amount in response to the DECREMENT signal. Of course, if the digitized samples which are compared in comparator 96 are equal, neither the INCREMENT nor the DECREMENT signals are produced, and the contents of register 98 remain the same.

Register 98 also includes preset terminals to which a preset digital signal may be supplied. For example, when the fader (with which the apparatus illustrated in FIG. 4 is used) first is actuated, or when the audio mixing apparatus first is energized, a preset digital signal representing a predetermined position, or volume level, is supplied to and stored in register 98. This preset value then is incremented or decremented as a function of the sliding movement of the operator's finger along the touch-sensitive strip in the manner described above. In this manner, the contents of register 98 are adjusted from the preset value until a desired value is stored therein. It is appreciated that the digital signal stored in the register is used as the encoded digital position, or volume level, signal provided by encoder 74 (FIG. 2). Hence, the digital signal stored in register 98 is used to energize display 18, to control the gain of the VCA 75, and is recorded in track $T_P$ by transducer 28.

As an alternative, the preset digital signal supplied to register 98 may be the initial digital signal produced by A/D converter 90 when touch-sensitive strip 16 first is actuated. Hence, in this alternative, the digital position, or volume level, signal with which register 98 is preset is representative of the initial setting of the fader, that is, it is representative of the initial position of the operator's finger along the touch-sensitive switch.

In the embodiment of FIG. 4, comparator 96 compares adjacent digitized samples which, of course, are recognized as digitized position sample signals. As an alternative, the comparator may compare the values of position sample signals which are not necessarily adjacent each other. This may be achieved by providing storage circuit 92 with a plurality of storage stages and shifting each position sample signal through such stages in synchronism with the sampling rate of A/D converter 90. Consequently, comparator 96 may compare the instantaneous position sample signal produced by the A/D converter with a preceding, or next preceding, or third preceding position sample signal, as desired.

As yet another embodiment, touch-sensitive strip 16, as illustrated in FIG. 4, may be operated so as to supply the aforementioned preset value of the digital position, or volume level, signal to register 98; and yet another, additional manually operable element may be used to effect fine adjustments to that stored digital signal. For example, a vernier coupled to a rheostat or potentiometer may be adjusted by the operator, and the particular position of the vernier, as represented by corresponding changes in the resistance of the rheostat or potentiometer coupled thereto, may be detected. Such changes then may be used to increment or decrement the digital signals stored in register 98. In this arrangement, A/D converter 90 may be coupled by, for example, a suitable switch or otherwise, to touch-sensitive strip 16, as when this touch-sensitive strip first is operated, or "touched" by the operator, and thereafter coupled to the output of the aforementioned vernier. The remaining circuitry, including storage circuit 92 and comparator 96, then may operate in the manner described above to detect changes in the position of the vernier so as to selectively increment or decrement the digital signal stored in register 98, this digital signal being produced by A/D converter 90 when touch-sensitive strip 16 first is "touched". Of course, in the aforementioned arrangement, the vernier may be replaced by other manually operable means; with a change in position of that means being detected and used to correspondingly adjust the digital signal stored in register 98. Hence, changes in the digital position, or volume level, signal may be effected while the operator carries out a mixing operation.

Let it now be assumed that the apparatus illustrated in FIG. 4 is used to record another "pass", as in an edit, dubbing or re-recording operation. As digital position, or volume level, signals are reproduced from, for example, tape T by transducer 28, these reproduced digital signals are supplied as the preset signals to each register 98 in the corresponding channels of the mixing apparatus. Thus, register 98 stores the previous digital signals which may be supplied by this register to decoder 80 (FIG. 2) for selectively energizing display 18. The operator thus is apprised of the previous settings of the fader. When tape T is stopped, the contents of register 98 represent the setting of the fader which had been selected at that location in the previous "pass". Now, for editing, dubbing or re-recording, the operator may move the position of his finger along touch-sensitive strip 16 so as to correspondingly adjust the digital signal stored in register 98 in the manner discussed above. If an additionally manually operable element is provided for fine adjustments to the digital signal stored in register 98, the operator may adjust this additional element, as mentioned previously. Thus, in editing, dubbing or re-recording, the operator may reset the fader as he desires.

If the audio mixing apparatus is provided with a master fader, as mentioned above, the external digital control signal produced by that master fader may be supplied as the preset signal to register 98 in each individual fader. The register thus stores a master digital signal which may be recorded on tape T and also used to selectively energize display 18. Adjustments in this master digital signal may be effected in the manner described above, such as by moving the operator's finger along touch-sensitive strip 16. Changes in the position of the operator's finger are detected and used to selectively increment or decrement the master digital signal stored in register 98.

Turning now to FIG. 5, there is illustrated a block diagram of an embodiment of encoder 74 that may be used with the touch-sensitive strip illustrated in FIG. 2. The encoder of FIG. 5 comprises counters 102 and 104, designated the Y-counter and X-counter, respectively, a scanner 106, registers 108 and 110, a subtractor 120, a comparator 122, an averaging circuit 124, and storage circuit 126, comparator 128 and register 130. Y-counter 102 is adapted to be supplied with clock pulses from a suitable clock pulse source (not shown) to generate Y-counts which identify respective ones of terminals $Y_1$–$Y_6$. The Y-counter is an electronic implementation of segment scanner 54 described above with respect to FIG. 2. Thus, depending upon the particular count of Y-counter 102, a corresponding one of the Y terminals is supplied with reference potential. As the count of the Y-counter increases, successive Y terminals are supplied with this reference potential. It is appreciated that the Y-counter is a cyclical counter which, when reaching the count corresponding to, for example, terminal $Y_1$, is reset, in response to the next clock pulse supplied thereto, to a count corresponding to terminal $Y_6$. Thus, the count of Y-counter 102 serves to address successive ones of segments 42–52. The count of this Y-counter is supplied to registers 108 and 110, and forms part of the digital signal which is used to represent the location of the operator's finger on touch-sensitive strip 16.

X-counter 104 is adapted to be supplied with clock pulses at a repetition rate greater than the repetition rate of the clock pulses supplied to Y-counter 102. In the embodiment of the touch-sensitive strip illustrated in FIG. 2 wherein ten conductive elements are provided in each of groups 62–72, X-counter 104 should be incremented ten times for each single increment in the count of Y-counter 102. Hence, the repetition rate of the clock pulses supplied to the X-counter should be ten times greater than the repetition rate of the clock pulses supplied to the Y-counter. The count of X-counter 104 serves to address, or scan, conductive elements $X_1$, $X_2$, ... $X_{10}$. Depending upon the count of X-counter 104, the corresponding conductive element in each of groups 62–72 is scanned, or sensed, to determine if the reference potential then is being supplied thereto. The count of X-counter 104 is coupled to each of registers 108 and 110 and, in addition, is coupled to scanner 106.

Scanner 106 may be thought of as a scanning switch which scans conductive elements $X_1$–$X_{10}$, individually and in sequence, in response to the count supplied thereto by X-counter 104. The scanner is adapted to detect the presence of the reference potential, such as ground, on the conductive element then being scanned thereby. An output pulse is produced by scanner 106 when reference potential on the conductive element is detected at the time that said conductive element is addressed by X-counter 104. In this manner, conductive elements $X_1$–$X_{10}$ are scanned sequentially to detect the presence of reference potential thereon. Preferably, the conductive elements are scanned in the order of $X_{10}$, $X_9$, $X_8$, ... $X_1$, that is, from the top to the bottom of the touch-sensitive strip illustrated in FIG. 2. Upon the first occurrence of reference potential detected on a scanned conductive element, scanner 106 produces an output pulse indicative thereof. This output pulse is coupled to a latch, or enable, input of register 108 and, additionally, to the set input S of a flip-flop circuit 112.

Upon the occurrence of the output pulse produced by scanner 106, register 108 is adapted to store therein the Y-count of Y-counter 102 and the X-count of X-counter 104. Thus, register 108 stores a digital count signal representing the particular conductive element in the particular group to which the reference potential is coupled. From the schematic illustration shown in FIG. 3, it is recognized that the digital signal stored in register 108 represents the relative location of the top portion of the operator's finger which is placed on touch-sensitive strip 16.

Flip-flop circuit 112 is coupled to one input of an AND gate 116, the other input of this AND gate being coupled to the output of scanner 106 by way of an inverter 114. It will be appreciated that after scanner 106 produces an output pulse in response to the detection of reference potential present on one of the conductive elements $X_1$–$X_{10}$, the scanner continues to scan these elements. It is expected, from the example shown in FIG. 3, that a number of conductive elements will have reference potential applied thereto in response to finger pressure exerted by the operator on strip 40. For example, when segment 46 (e.g. terminal $Y_4$) is addressed by Y-counter 102, it is expected that reference potential will be applied at least to conductive elements $X_{10}$, $X_9$, $X_8$ and $X_7$ (as shown in FIG. 3). This is detected by scanner 106 which produces an output pulse when conductive element $X_{10}$ is scanned, and this output pulse terminates when conductive element $X_7$ is scanned. Upon the termination of this output pulse, inverter 114 supplies a relatively high level signal to AND gate 116, whereupon a latch or enable pulse is supplied by this AND gate to register 110. The Y-count and X-count now supplied to and stored in register 110 represents the location of the bottom portion of the operator's finger on touch-sensitive strip 16.

The counts stored in registers 108 and 110 are coupled to respective inputs of subtractor 120 and, additionally, to averaging circuit 124. The subtractor is adapted to subtract the count stored in register 110 from the count stored in register 108 and constitutes checking means for checking that the conductive elements corresponding to the counts respectively representing the locations of the top and bottom portions of the operator's finger on the touch-sensitive strip 16 are spaced apart by a predetermined minimum distance. The difference between these counts is seen to be a representation of the dimension of the operator's finger on touch-sensitive switch 16. In the event that an external disturbance causes strips 40 and 60 to contact each other, or in the event that the contact between these strips is inadvertent or accidental, it is expected that the difference between the counts stored in registers 108 and 110 in response to such external disturbance or inadvertent contact is less than a predetermined amount, the latter being representative of, for example, a minimum dimension of the operator's finger. The output of subtractor 120 is coupled to comparator 122 wherein the difference between the counts stored in registers 108 and 110 is compared to a digital signal representing this predetermined minimum amount supplied to the comparator by a suitable reference source. If the output of subtractor 120, that is, if the difference between the counts stored in registers 108 and 110, exceeds this predetermined amount, an enable signal is supplied to averaging circuit 124. The averaging circuit thus is enabled to obtain an average count from the counts stored in registers 108 and 110. Thus, if it is determined that the length of strip 40 which contacts strip 60 is at least equal to the expected dimension of the operator's finger, it is concluded that the counts stored in registers 108 and 110 are due to the placing of the operator's finger on the touch-sensitive strip, and averaging circuit 124 is enabled. Hence, an "average" count, or digital position signal, is produced by the averaging circuit by combining the counts then stored in registers 108 and 110. This digital signal produced by the averaging circuit corresponds to the position sample signal which is produced by A/D converter 90 discussed above with respect to FIG. 4. This position sample signal may be an "average" of the counts representing the top and bottom, respectively, of the operator's finger placed upon touch-sensitive switch 16. It is recognized that this is an approximation of the location of contact between strips 40 and 60.

The position sample signal produced by averaging circuit 124 is coupled to storage circuit 126. This storage circuit is similar to storage circuit 92, described above in the embodiment of FIG. 4. A latch terminal of storage circuit 126 is coupled to a terminal 118 to which a latch pulse is applied when Y-counter 102 and X-counter 104 attain a predetermined count corresponding to, for example, the bottommost conductive element included in strip 70. Thus, when the Y-count corresponds to terminal $Y_1$ and the X-count corresponds to conductive element $X_1$, the latch pulse is applied to terminal 118. Storage circuit 126 is enabled in response to this latch pulse to store therein the position sample signal supplied thereto by averaging circuit 124.

The latch pulse supplied to terminal 118 also is coupled to the reset input R of flip-flop circuit 112, thereby resetting the flip-flop circuit to disable AND gate 116, in preparation for detecting the next occurrence of reference potential applied to a scanned conductive element.

The position sample signal stored in storage circuit 126 is coupled to one input of comparator 128; and the instantaneous position sample signal, that is, the position sample signal next produced by the averaging circuit, is supplied to another input of comparator 128. In this regard, it is seen that comparator 128 is similar to aforedescribed comparator 96.

In the event that the relative position of the operator's finger on touch-sensitive switch 16 changes, the position sample signal produced by averaging circuit 124 also will change. Thus, the position sample signal then produced by the averaging circuit will differ from the preceding position sample signal which is stored in storage circuit 126, resulting in comparator 128 producing either the INCREMENT or DECREMENT signal, depending upon the direction in which the operator moves his finger. If the operator slides his finger in the upward direction, the instantaneous position sample signal produced by averaging circuit 124 will be larger than the preceding position sample signal, resulting in the production of the INCREMENT signal by comparator 128. Conversely, if the operator slides his finger in the downward direction, the instantaneous position sample signal produced by averaging circuit 124 will be less than the preceding position sample circuit, resulting in the production of the DECREMENT signal by comparator 128.

The INCREMENT and DECREMENT signals are coupled to the count-up and count-down terminals, respectively (not shown), of register 130. This register may be similar to aforedescribed register 98 and, thus, may be a presettable up/down counter. A digital position, or volume level, signal stored in register 138 is selectively incremented or decremented in response to the INCREMENT or DECREMENT signals supplied to the register by comparator 128. In one embodiment, the digital signal stored in the register is incremented (or decremented) by a predetermined count (e.g. a count of one); and in another embodiment, the digital signal stored in the register is incremented (or decremented) by a plurality of counts. In a still further embodiment, the digital signal stored in register 130 is incremented (or decremented) by a number of counts corresponding to the difference between the position sample signals which are compared by comparator 128. Hence, the larger the difference between these compared signals, the greater is the digital signal stored in register 130 incremented (or decremented).

The digital signal to which register 130 is preset may be the same as the digital signal to which previously described register 98 is preset. As mentioned above, this preset digital signal may be a predetermined signal supplied by a suitable source (not shown) when the fader (with which the apparatus illustrated in FIG. 5 is used) first is actuated, or when the audio mixing apparatus first is energized. Alternatively, the digital signal to which register 130 is preset may be the position sample signal first produced by averaging circuit 124 when touch-sensitive strip 16 first is actuated. Still further, register 130 may be preset with the digital signals which are reproduced from, for example, track $T_P$ of tape T by transducer 28, as during a signal reproducing operation. This presets the register with the digital signal representing the previous setting of the fader in preparation for recording another "pass", as during editing, dubbing or re-recording.

In operation, when the operator places his finger upon the touch-sensitive strip, as illustrated in FIG. 3, the segments of strip 40 and the conductive elements in each group of strip 60 are scanned by the combination of counters 102 and 104 and scanner 106 to sense a reference potential at a scanned conductive element. Assuming that the scanning of the conductive elements commences with the top-most conductive element illustrated in FIG. 2, register 108 stores the Y-count and X-count representing the top-most location of the operator's finger on the touch-sensitive strip. Scanning continues, however, and register 110 stores the Y-count and X-count representing the bottom-most location of the operator's finger along the touch-sensitive strip. The difference between the top-most and bottom-most locations is obtained by subtractor 120 and, if this difference is equal to or greater than a predetermined amount, as sensed by comparator 122, the counts stored in registers 108 and 110 are combined in averaging circuit 124 to produce a position sample signal. In the event that the difference between the counts stored in registers 108 and 110 is not greater than the predetermined minimum amount, it is assumed that the touch-sensitive strip is actuated unintentionally or by an object other than an operator's finger and, thus, the counts stored in the registers are not utilized by averaging circuit 124.

In view of the repetitive scanning of the conductive elements and segments of the touch-sensitive strip, averaging circuit 124 generates periodic position sample signals. Comparator 128 compares the latest, or instantaneous, position sample signal to a preceding position sampling signal, the latter being stored in storage circuit 126, to produce INCREMENT or DECREMENT signals, depending upon the difference between such position sample signals. The digital signal which had been stored in register 130 then is incremented or decremented in response to the INCREMENT or DECREMENT signal, respectively, produced by comparator 128. Thus, changes in the position of the operator's finger along the touch-sensitive strip are reflected by changes in the digital signal stored in register 130. This digital signal, having been adjusted by changes in the position of the operator's finger, is used to energize display 18 and, during a recording operation, is recorded by, for example, transducer 28.

While the present invention has been particularly shown and described with reference to certain preferred embodiments, it will be readily appreciated by those of ordinary skill in the art that various changes and modifications in form and details may be made without departing from the spirit and scope of the invention. For example, and as mentioned above, the digital signal stored in register 98 (FIG. 4) or register 130 FIG. 5) may be incremented or decremented by a predetermined amount, such as one count, in response to the INCREMENT or DECREMENT signals supplied thereto. Alternatively, the digital signal may be incremented or decremented by an amount proportional to the difference between the position sample signals which are compared by comparator 96 (FIG. 4) or comparator 128 (FIG. 5).

As another modification, the touch-sensitive strip illustrated in FIG. 2 need not be divided into individual, insulated segments and groups. Rather, strip 40 may be a single, continuous, electrically conductive strip, and all of the conductive elements provided on strip 60 may be scanned individually. As a numerical example, in the embodiment of FIG. 2, strip 60 is provided with six groups, each group containing ten conductive elements, resulting in a total of sixty conductive elements. In the modification described herein, sixty individual conductive elements may be coupled to sixty corresponding inputs of encoder 74, and the application of reference potential to a particular one of these conductive elements is detected by scanning each of the sixty conductive elements, in sequence. It is appreciated that the embodiment illustrated in FIG. 2 is preferred because it is implemented by circuitry of relatively simpler and less expensive construction.

As a still further modification, the encoder circuitry illustrated in FIGS. 4 and 5 may be used with other slidable positioning devices and need not be limited solely for application with touch-sensitive strips. For example, the relative position of a conventional slide lever may be detected; and fine adjustments to the digital signal which represents this position may be made by manually operating a further device, such as a vernier.

Still further, the embodiments included in FIGS. 2, 4 and 5 may be implemented by a suitably programmed processor, such as a conventional microprocessor, to carry out the functions and operations described above.

It is intended that the appended claims be interpreted as including the foregoing as well as other changes and modifications.

What is claimed is:

1. Apparatus comprising a plurality of channels of audio signals and, in association with each of said channels, a touch-sensitive strip having first and second overlying portions are of which is relatively flexible with respect to the other so as to contact said other portion at a location corresponding to the position of an operator's finger thereon; detecting means for detecting said contact and for detecting said contact and for producing a signal in response thereto; and encoding means coupled to said detecting means for encoding said produced signal into a digital signal representing said contact location, whereby each of said channels can be faded independently of the others by movement of the operator's finger; wherein one of said overlying portions of said touch-sensitive strip is provided with multiple discrete conductive elements and the other portion is provided with a reference potential which is coupled to at least one conductive element as a function of the particular location of contact of said portions.

2. The apparatus of claim 1 wherein when said portions contact each other in response to an operator's finger placed thereon, and said reference potential is coupled to first and second conductive elements spaced apart by a distance which approximately corresponds to the dimension of the operator's finger placed on said touch-sensitive strip.

3. The apparatus of claim 2 wherein the portion of said touch-sensitive strip provided with said reference potential comprises a plurality of individual segments, each connected to receive said reference potential, and said portion of said touch-sensitive strip provided with said conductive elements comprises a like plurality of individual groups, each of said groups being opposite a respective segment and having a number of conductive elements, said reference potential being coupled to a conductive element in a group when an opposing segment is brought into contact therewith.

4. Apparatus comprising a touch-sensitive strip having first and second overlying portions, one of which is relatively flexible with respect to the other so as to contact said other portion at a location corresponding to the position of an operator's finger thereon; detecting means for detecting said contact and for producing a signal in response thereto; and encoding means coupled to said detecting means for encoding said produced signal into a digital signal representing said contact location;

one of said overlying portions of said touch-sensitive strip being provided with multiple discrete conductive elements and the other portion being provided with a reference potential which is coupled to at least one conductive element as a function of the particular location of contact of said portions;

said portions contacting each other in response to an operator's finger placed thereon, and said reference potential being coupled to first and second conductive elements spaced apart by a distance which approximately corresponds to the dimension of the operator's finger placed on said touch-sensitive strip;

the portion of said touch-sensitive strip provided with said reference potential comprising a plurality of individual segments, each being connected to receive said reference potential, and said portion of said touch-sensitive strip provided with said conductive elements comprising a like plurality of individual groups, each of said groups being opposite a respective segment and having a number of conductive elements, said reference potential being coupled to a conductive element in a group when an opposing segment is brought into contact therewith;

the respective conductive elements in said groups being connected in common, and said detecting means comprising segment scanning means for scanning successive segments to supply said reference potential in the scanned segments in succession, and group scanning means for scanning successive conductive elements to detect the conductive elements having said reference potential coupled thereto.

5. The apparatus of claim 4 wherein said encoding means comprises segment counting means for producing a segment count representing the segment scanned by said segment scanning means; conductive element counting means for producing a conductive element count representing the conductive element scanned by said group scanning means; and means for storing the segment and conductive element counts representing the conductive element which is detected as having said reference potential coupled thereto, said segment and conductive element counts representing said contact location of the overlying portions of said touch-sensitive strip.

6. The apparatus of claim 5 wherein said means for storing the segment and conductive element counts includes top count storage means for storing the segment and conductive element counts representing said first conductive element to which said reference potential is coupled and bottom count storage means for storing the segment and conductive element counts representing said second conductive element to which said reference potential is coupled; and wherein said encoding means further includes determining means for determining if the difference between the counts representing said first and second conductive elements is equal to or greater than a predetermined minimum amount, and means responsive to said determining means for deriving from said counts a digital signal representing the location of said operator's finger.

7. The apparatus of claim 6 wherein said segment and conductive element counting means are cyclical counters and are repetitively cycled; and wherein said encoding means further includes storage means for temporarily storing a preceding derived digital signal representing the location of said operator's finger, comparator means for comparing the digital signal then being derived to a stored digital signal to provide an output when the compared signals differ, and register means for storing a signal and for changing the value of the signal stored therein as a function of the output provided by said comparator means.

8. The apparatus of claim 7 further comprising preset means coupled to said register means for loading said register means with a signal of preset value representing a preset location of contact of said portions of the touch-sensitive strip.

9. The apparatus of claim 8 wherein said preset value is changed when the location of contact of said portions of the touch-sensitive strip is changed, as by sliding movement of the operator's finger thereon, irrespective of the absolute position of said operator's finger on the touch-sensitive strip.

10. Apparatus comprising a touch-sensitive strip having first and second overlying portions one of which is relatively flexible with respect to the other so as to contact said other portion at a location corresponding to the position of an operator's finger thereon; detecting means for detecting said contact and for producing a signal in response thereto; and encoding means coupled to said detecting means for encoding said produced signal into a digital signal representing said contact location;

one of said overlying portions of said touch-sensitive strip being provided with multiple discrete conductive elements and the other portion being provided with a reference potential which is coupled to at least one conductive element as a function of the particular location of contact of said portions;

said portions contacting each other in response to an operator's finger placed thereon, and said reference potential being coupled to first and second conductive elements spaced apart by a distance which approximately corresponds to the dimension of the operator's finger placed on said touch-sensitive strip; and said detecting means comprising;

scanning means for scanning said conductive elements successively to detect the conductive elements having said reference potential coupled thereto; and said encoding means comprises identifying means for identifying said first and second conductive elements which are detected as having said reference potential coupled thereto, checking means for checking that said first and second conductive elements are spaced apart by a predetermined minimum distance and combining means responsive to said checking means for combining the identities of said first and second conductive elements to identify the approximate location of said operator's finger.

11. The apparatus of claim 10 wherein said encoding means further includes sensing means for sensing a change in the location of said operator's finger, register means for storing a digital position signal, and means for modifying said digital position signal as a function of said sensed change in the location of said operator's finger.

12. Volume control means comprising a plurality of channels of audio signals and, in association with each of said channels, a touch-sensitive strip having overlying portions one of which is relatively flexible with respect to the other so as to establish a contact location along said strip corresponding to the position of an operator's finger thereon; detecting means for detecting said contact location; encoding means coupled to said detecting means for encoding the detected contact location to produce a digital volume level signal representing said contact location; and adjustment means responsive to incremental sliding movement of said operator's finger along said strip to correspondingly adjust said digital volume level signal in a direction corresponding to the direction of said incremental sliding movement, whereby each of said channels can be faded independently of the others.

13. The apparatus of claim 12 wherein one of said overlying portions of said touch-sensitive strip is provided with resistive means over a predetermined length thereof and the other portion is provided with a reference potential which, when said portions contact each other, establishes an effective resistance of said resistive means as a function of the particular location of contact of said portions.

14. The apparatus of claim 13 wherein said detecting means comprises a resistor connected in series with said resistive means to form a voltage divider circuit having a dividing ratio determined by said particular location of contact of said portions, said voltage divider having input and output terminals; and a source of voltage coupled to said input terminal; said output terminal being coupled to said encoding means to supply thereto a voltage whose value is established by said dividing ratio.

15. The apparatus of claim 14 wherein said encoding means comprises analog-to-digital converting means for converting the voltage supplied by the output terminal of said voltage divider to a corresponding digital signal.

16. The apparatus of claim 15 wherein said encoding means includes means for periodically converting said voltage supplied by said output terminal of said voltage divider to a corresponding digital signal; storage means for temporarily storing a preceding digital signal; comparator means for comparing the digital signal then being produced by said analog-to-digital converting means to a stored digital signal to provide an output when the compared signals differ; and register means for storing a signal and for changing the value of the signal stored therein as a function of the output provided by said comparator means.

17. The apparatus of claim 16 further comprising preset means coupled to said register means for loading said register means with a signal of preset value representing a preset location of contact of said portions of the touch-sensitive strip.

18. The apparatus of claim 17 wherein said preset value is changed when the location of contact of said portions of the touch-sensitive strip is changed, as by sliding movement of the operator's finger thereon, irrespective of the absolute position of said operator's finger on the touch-sensitive strip.

19. Volume control means comprising a touch-sensitive strip having overlying portions one of which is relatively flexible with respect to the other so as to establish a contact location along said strip corresponding to the position of an operator's finger thereon; detecting means for detecting said contact location; encoding means coupled to said detecting means for encoding the detected contact location to produce a digital volume level signal representing said contact location; and adjustment means responsive to incremental sliding movement of said operator's finger along said strip to correspondingly adjust said digital volume level signal in a direction corresponding to the direction of said incremental sliding movement;

said encoding means being operative to produce successive digital volume level signals; and said adjustment means comprising storage means for temporarily storing and preceding digital volume level signal; comparator means for comparing the digital volume level signal then being produced to said stored digital volume level signal to produce an output; and means for changing said digital volume level signal by an incremental amount in response to said output.

20. The volume control means of claim 19 wherein said comparator means produces an increment output signal when the digital volume level signal then being produced exceeds said stored digital volume level signal and produces a decrement output signal when the digital volume level signal then being produced is less than said stored digital volume level signal.

21. The volume control means of claim 20 wherein said means for changing comprises register means for storing a digital volume level signal and for selectively incrementing or decrementing said digital volume level signal stored therein in response to said increment or decrement output signal, respectively.

22. The volume control means of claim 21, further comprising preset means coupled to said register means for supplying a preset digital volume level signal to be stored therein.

23. Apparatus comprising adjustable means having a slidable position adjustment element for producing a signal representing the relative position of said slidable position adjustment element; encoding means for encoding said signal to produce a digital position signal; display means responsive to a digital position signal for displaying the relative position of said slidable position adjustment element; and adjustment control means for effecting fine adjustments to said digital position signal, whereby said display means provides corresponding adjustments in the displayed relative position;

said display means comprising light emitting means;

said light emitting means comprising an array of light emitting elements, each element being selectively energizable to represent the relative position of said slidable position adjustment element;

said display means further comprising decoding means for decoding said digital position signal, and energizing means coupled to said decoding means for energizing a corresponding light emitting element;

said adjustment control means including said slidable position adjustment element; sensing means for sensing a change in the relative position of said slidable position adjustment element; and increment means responsive to said sensing means for changing said digital position signal;

said sensing means comprising sampling means for successively sampling the position of said slidable position adjustment element to produce successive position sample signals; storage means for temporarily storing a preceding position sample signal; and comparator means for comparing the stored position sample signal to a succeeding position sample signal.

24. The apparatus of claim 23 wherein said increment means comprises means for increasing the value of said digital position signal by a predetermined incremental amount when the compared signals differ from each other by at least a predetermined minimum of a first polarity, and means for decreasing the value of said digital position signal by said predetermined incremental amount when the compared signals differ from each other by at least said predetermined minimum of a second polarity.

25. Volume control means comprising adjustable means having a slidable volume adjustment element for producing a signal representing a relative volume level; encoding means for encoding said signal to produce a digital volume level signal; display means responsive to said digital volume level signal for displaying said relative volume level; and adjustment control means for effecting fine adjustments to said digital volume level signal and corresponding adjustments in said display;

said adjustment control means comprising manually operable positioning means; sensing means for sensing a change in the relative position of said manually operable positioning means; and increment means responsive to said sensing means for changing said digital position signal;

said sensing means comprising sampling means for successively sampling the position of said manually operable positioning means to produce successive position sample signals; storage means for temporarily storing a preceding position sample signal; and comparator means for comparing the stored position sample signal to a succeeding position sample signal.

26. The volume control means of claim 25 wherein said increment means comprises presettable register means for storing a preset digital volume level signal; means for incrementing the value of the digital volume level signal stored in said presettable register means when the compared succeeding position sample signal exceeds the preceding position sample signal by a predetermined amount; and means for decrementing the value of the digital volume level signal stored in said presettable register means when the compared succeeding position sample signal is less than the preceding position sample signal by said predetermined amount.

* * * * *